United States Patent
Kim et al.

(10) Patent No.: US 8,242,670 B2
(45) Date of Patent: Aug. 14, 2012

(54) ELECTROMAGNETIC WAVE BLOCKING MEMBER FOR DISPLAY APPARATUS

(75) Inventors: Eui Soo Kim, Suwon-si (KR); Jechoon Ryoo, Gyeongsangbuk-do (KR); Jeonghong Oh, Gyeongsangbuk-do (KR); Hongik Kim, Gyeongsangbuk-do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 343 days.

(21) Appl. No.: 12/220,019

(22) Filed: Jul. 21, 2008

(65) Prior Publication Data

US 2009/0051258 A1 Feb. 26, 2009

(30) Foreign Application Priority Data

Aug. 24, 2007 (KR) .................. 10-2007-0085712

(51) Int. Cl.
 H01J 5/16 (2006.01)
 H01J 61/40 (2006.01)
 H01K 1/26 (2006.01)
 H01K 1/30 (2006.01)
(52) U.S. Cl. ......... 313/112; 313/110; 313/111; 361/818
(58) Field of Classification Search .......... 313/110–112; 361/818
 See application file for complete search history.

(56) References Cited

U.S. PATENT DOCUMENTS

| | | | | |
|---|---|---|---|---|
| 4,871,220 A | * | 10/1989 | Kohin | 359/350 |
| 6,054,647 A | * | 4/2000 | Ridener | 174/392 |
| 6,492,587 B1 | * | 12/2002 | Yoshinaga | 174/350 |
| 7,119,479 B2 | * | 10/2006 | Hori et al. | 313/110 |
| 2003/0142486 A1 | * | 7/2003 | Arakawa et al. | 361/818 |
| 2005/0105009 A1 | * | 5/2005 | Dunn et al. | 349/21 |
| 2005/0178569 A1 | * | 8/2005 | Kotsubo | 174/35 MS |
| 2005/0247470 A1 | * | 11/2005 | Fleming et al. | 174/35 MS |
| 2007/0080643 A1 | * | 4/2007 | Shin | 313/587 |
| 2007/0152555 A1 | * | 7/2007 | Park et al. | 313/112 |
| 2007/0188066 A1 | * | 8/2007 | Arakawa et al. | 313/238 |

(Continued)

FOREIGN PATENT DOCUMENTS

JP 1989-170098 A 5/1989

(Continued)

OTHER PUBLICATIONS

Office Action issued by the Korean Intellectual Patent Office on Sep. 29, 2009 for corresponding Korean Patent Application No. 10-2007-0085712.

*Primary Examiner* — Anne Hines
*Assistant Examiner* — Jose M Diaz
(74) *Attorney, Agent, or Firm* — Lerner, David, Littenberg, Krumholz & Mentlik, LLP

(57) ABSTRACT

Disclosed is an electromagnetic wave blocking member for a display apparatus. The electromagnetic wave blocking member may include a transparent substrate, an electrode layer, and a transparent conductive layer. The electrode layer can include i) a grounding electrode corresponding to at least one frame area of the transparent substrate, and ii) an auxiliary electrode overlying the transparent substrate for connection with the grounding electrode and having a mesh or stripe pattern. The transparent conductive layer can be formed either on the electrode layer or between the transparent substrate and the electrode layer. In one example, the transparent conductive layer can include a series of a metal thin film alternating with a metal oxide thin film a plurality of times.

13 Claims, 4 Drawing Sheets

U.S. PATENT DOCUMENTS

| | | | |
|---|---|---|---|
| 2007/0258160 A1* | 11/2007 | Cha | 359/883 |
| 2008/0200333 A1* | 8/2008 | Gotou et al. | 503/225 |
| 2008/0277157 A1* | 11/2008 | Naito et al. | 174/392 |
| 2009/0058250 A1* | 3/2009 | Sin et al. | 313/112 |
| 2009/0117342 A1* | 5/2009 | Lee et al. | 428/195.1 |
| 2009/0160337 A1* | 6/2009 | Park et al. | 313/587 |
| 2009/0167173 A1* | 7/2009 | Park et al. | 313/582 |
| 2010/0019668 A1* | 1/2010 | Koo | 313/504 |

FOREIGN PATENT DOCUMENTS

| | | |
|---|---|---|
| JP | 09-232278 A | 9/1997 |
| KR | 1020020076899 | 10/2002 |
| KR | 20030069876 A | 8/2003 |
| KR | 10-0617473 | 8/2006 |
| WO | WO 2007069870 A1 * | 6/2007 |
| WO | WO 2008010624 A1 * | 1/2008 |

* cited by examiner (a)

(b)

(a)

(b)

ELECTROMAGNETIC WAVE BLOCKING MEMBER FOR DISPLAY APPARATUS

CROSS-REFERENCE TO RELATED APPLICATION

This application claims the benefit of Korean Patent Application No. 10-2007-0085712, filed on Aug. 24, 2007, in the Korean Intellectual Property Office, the entire disclosure of which is incorporated herein by reference.

BACKGROUND OF THE INVENTION

1. Field of the Invention

The present invention relates to an electromagnetic wave blocking member for a display apparatus, and more particularly, to an electromagnetic wave blocking member for a display apparatus which can simplify the manufacturing process, and improve an electromagnetic wave-blocking capacity.

2. Description of Related Art

As modern society becomes more information oriented, technology of parts and devices related to image displays is remarkably advancing, and these parts and devices are becoming widespread. Display apparatuses utilizing parts and devices related to photoelectronics are becoming significantly widespread and used for television apparatuses, monitor apparatuses of personal computers, and the like. Also, display apparatuses are becoming both larger and thinner. Plasma display panel (PDP) apparatuses are gaining popularity as next-generation display apparatuses to simultaneously satisfy a trend of becoming larger, and of becoming thinner, when compared with cathode-ray tubes (CRTs) representing existing display apparatuses. Also, the PDP apparatuses exhibit superior display characteristics such as display resolution, brightness, contrast ratio, an afterimage, a viewing angle, and the like.

In general, PDP apparatuses generate a gas discharge between electrodes by a direct current (DC) voltage or an alternating current (AC) voltage which are supplied to the electrodes. Here, ultraviolet light is generated, and then, a phosphor is excited by the ultraviolet light, thereby emitting light. As a result, the PDP apparatus has a defect in that an amount of emitted electromagnetic (EM) radiation and near infrared (NI) radiation with respect to a driving characteristic is great, and thus, EM radiation and NI radiation generated in the PDP apparatus may have harmful effects on human bodies, and cause sensitive equipment such as wireless telephones, remote controls, and the like, to malfunction. Therefore, in order to use the PDP apparatus, it is required to prevent emission of EM radiation and NI radiation emitted from the PDP apparatus from increasing to more than a predetermined level. For this purpose, an EM radiation shielding plate may be positioned on a front surface of a display screen of the PDP apparatus, and is required to have good see-through characteristics of the display screen.

However, the PDP apparatus is required to have various functions such as shielding NI radiation, reducing reflected light, enhancing color purity, and improving a contrast ratio in a bright room, as well as shielding the EM radiation. For this purpose, the PDP apparatus may adopt a PDP filter for simultaneously satisfying the above described functions. The PDP filter may be constructed such that a plurality of functional films such as an EM radiation-shielding film, an NI radiation-shielding film, a color correction film, an external light shielding film, and the like or multifunctional films such as an simultaneous EM-radiation shielding and NI-radiation shielding film, an both external light shielding and color correction film, and the like are stacked one upon another. Recently, attempts for simplifying the manufacturing process and reducing costs of PDP filters while simultaneously improving the above described functions have been made.

In existing EM radiation-shielding films, a scheme using a metal mesh, and a scheme coating a transparent electroconductive thin film may be used. As examples for the scheme using the metal mesh, a scheme for weaving a fiber coated with a metal and a scheme for etching a thin copper foil may be designated. Here, the mesh film obtained by the etching scheme may be generally used.

The scheme for etching the thin copper foil may be performed by the following processes. First, a copper film may be formed by a plating scheme, and then surface treatments may be executed on the copper film such as a blackening treatment for improvement of image quality, a surface ruggedness treatment for improvement of adhesive force, an antioxidant treatment, and the like. Next, the copper foil may be adhered on a polyethylene terephthalate (PET) film using an adhesive agent. Next, a pattern may be formed on the adhered copper film using a lithography method, and the copper film with the pattern may be partially etched, thereby fabricating the mesh film.

However, the mesh film fabricated by the etching scheme may have problems such as a high processing cost for the etching itself, a high material cost caused due to having to remove 90% or more of the copper, and the like. Alternatively, in order to reduce the dissipation of the copper caused by the etching scheme, a seed layer for electroless plating may be formed by the lithography method, and the copper may be formed on the seed layer by a plating method. However, there still arise problems such as complexity in the process performed by the lithography method.

Also, the scheme of coating the transparent electroconductive thin film disadvantageously has a poor EM radiation-shielding function in comparison with the scheme of using the metal mesh.

SUMMARY OF THE INVENTION

An aspect of the present invention provides an electromagnetic wave blocking member for a display apparatus which may increase an electromagnetic wave-blocking efficiency even when using an electromagnetic wave-blocking layer of a conductive film type. According to an aspect of the present invention, there is provided an electromagnetic wave blocking member for a display apparatus, the electromagnetic wave blocking member including: a transparent substrate; an electrode layer; and a transparent conductive layer. In accordance with an aspect of the invention, the transparent conductive layer can be formed on the electrode layer. In another embodiment, the transparent conductive layer can be formed between the transparent substrate and the electrode layer. The transparent conductive layer can include a metal thin film alternating with a metal oxide thin film a plurality of times. In this instance, the electrode layer may include i) a grounding electrode overlying a frame area of the transparent substrate, and ii) an auxiliary electrode overlying the transparent substrate to be connected with the grounding electrode and having a mesh or stripe pattern. The auxiliary electrode can overlie an area of the transparent substrate bounded by the frame area.

Also, the transparent substrate may be made, for example, of a glass or a transparent polymer resin. In this instance, acrylic, polycarbonate (PC), polyethylene terephthalate (PET), and the like each having excellent transparency and thermal resistance may be used for the transparent polymer resin. The transparent substrate may serve as a support of a filter for the display apparatus.

Also, the transparent substrate may include a plurality of wedge-shaped grooves formed on a surface thereof. The plurality of wedge-shaped grooves can be filled with a conductive substance.

Also, a line width of the auxiliary electrode may be about 10 to 100 µm, and a pitch thereof can be about 2 to 100 mm.

Also, the auxiliary electrode can include a silver paste, and the silver paste can include at least one substance selected from the group consisting of carbon, cobalt, and copper. The auxiliary electrode can be formed by a process which includes subjecting the silver paste to blackening treatment.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS

Figure 1:
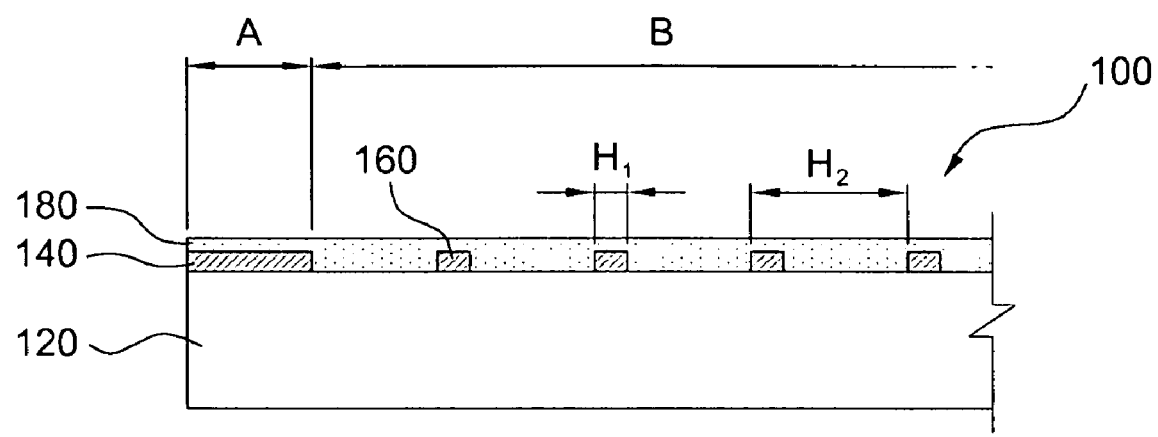
FIG. 1 is a cross-sectional diagram illustrating an electromagnetic wave blocking member for a display apparatus according to one embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

An electromagnetic (EM) wave blocking member for a display apparatus according to present invention may be used acting as a part of a filter for a display apparatus. The display apparatus according to the present invention may be diversely applied to large-sized display apparatuses such as plasma display panel (PDP, hereinafter referred to as 'PDP') apparatuses having red, green and blue pixels formed in a lattice pattern to implement the RGB color model, organic light emitting diode (OLED) apparatuses, liquid crystal display (LCD) apparatuses, field emission display (FED) apparatuses, and the like; and small-size mobile display apparatuses such as personal digital assistants (PDA), display screens of portable games, display windows of mobile phones, and the like; and flexible display apparatuses. PDP apparatuses and PDP filters having an EM wave blocking function are herein described in detail.

Although not shown, the PDP apparatus according to the exemplary embodiment of the present invention may include a case, a cover covering an upper part of the case, a driving circuit board received in the case, a panel assembly including light emitting cells where a gas discharge phenomenon occurs and a phosphor layer, and a PDP filter. Each of the light emitting cells is filled with a discharge gas such as helium-xeon (He—Xe) or helium-neon (Ne—He). The panel assembly basically has the same emitting phenomenon as a fluorescent lamp, in which an ultraviolet emitted from the discharge gas according to a gas discharge occurring in the light emitting cells may excite a phosphor layer to emit light, thereby being converted into visible light.

The PDP filter is arranged on a top portion of a front panel of the panel assembly. The PDP filter may be arranged spaced apart from the front panel or arranged on the front panel to be in physical contact. Also, the PDP filter and the front panel may be combined with the adhesive or a gluing agent to prevent undesirable effects such as foreign substances entering a space therebetween, and reinforce the PDP filter itself.

The PDP filter may include an EM wave blocking member made of a material with excellent conductivity formed on a transparent substrate, and the EM wave blocking member may be grounded via the cover. Specifically, the EM wave generated from the panel assembly is grounded to the cover and the case via the EM wave blocking member of the PDP filter, before reaching a viewer.

The PDP filter may include functional films such as an anti-reflection film, a color correction film, a Near Infrared (NI) ray blocking film, and the like. However, the functional films of the PDP filter according to the present invention may not be limited thereto, and a single layer obtained by combining the functional films may perform multiple functions, or the PDP filter may further include a protection film, an external light blocking film, and the like other than the functional films.

The anti-reflection film may prevent an external light entering from a viewer side from being reflected to the outside, thereby improving a contrast ratio of the display apparatus. The anti-reflection film may be preferably formed on a surface of the PDP filter facing the viewer side, that is, a surface opposite to the panel assembly when the PDP filter is mounted to the PDP apparatus, however, the formed order of the anti-reflection film is not limited thereto.

The anti-reflection film may use a thin film including a fluorine-based transparent polymer resin or a magnesium fluoride, a silicon-based resin, or a silicon oxide, preferably each having a refractive index of 1.5 or less in a visible region, and more preferably each having 1.4 or less.

The PDP filter may include the color correction film selectively absorbing light of specific wavelength range. The color correction film may reduce or adjust an amount of red (R), green (G), and blue (B) to change or correct the color balance, thereby increasing a color gamut and sharpness of the display apparatus. The color correction film may include various colorants. Pigments or dyes may be used for the colorants. As the examples of the colorants, organic colorants having neon light-shielding function, such as anthraquinone-based colorants, cyanine-based colorants, azo-based colorants, stilbene-based colorants, phthalocyanine-based colorants, methane-based colorants, and the like, may be used, and the present invention is not limited thereto. Since kinds and concentrations of the coloring agents are determined by absorption wavelength, absorption coefficients, and transmittance characteristics required for displays, various numerical values may be used without being limited to a specific value.

Also, the PDP filter may include the NI ray blocking film. The NI ray blocking film may function to block a relatively strong NI ray generated from the panel assembly and causing electronic devices such as a wireless phone or a remote control and the like to malfunction. In order to block the NI ray, a polymer resin containing NI absorbing colorants for absorbing a wavelength of an NI region may be used for the NI ray blocking film. As examples of the NI absorbing colorant, organic colorants such as cyanine-based colorants, anthraquinone-based colorants, naphthoquinone-based colorants, phthalocyanine-based colorants, naphthalocyanine-based colorants, diimmonium-based colorants, nickeldithiol-based colorants, and the like may be used. The PDP apparatus may emit a strong NI ray over a relatively wide wavelength region, and therefore a need for the NI ray blocking film capable of absorbing the NI ray over the relatively wide wavelength region arises.

The NI ray blocking film, the color correction film, and the anti-reflection film may be separately provided, or a single film performing multiple functions acquired by combining the above-described functional films may be provided. For example, a single film performing anti-reflection and color correction functions, and another single film performing anti-reflection, color correction, and NI ray blocking functions may be used. In this case, positions where the films are positioned may be appropriately determined according to the configuration of films.

Also, the PDP filter may include the external light blocking film. The external light blocking film may function to absorb external light to thereby prevent the external light from entering the panel assembly, and through internal reflection be emitted from the panel assembly to the viewer side. As a result, a high transmittance and contrast ratio with respect to the visible ray may be obtained.

When each layer or each film of the PDP filter according to the present exemplary embodiment of the invention is stuck together, a transparent gluing agent or adhesive may be used. Examples of the agents may include an acrylic adhesive, a silicon adhesive, an urethane adhesive, a polyvinyl butyral adhesive (PMB), an ethylene-vinyl acetate adhesive (EVA), a polyvinyl ether, a saturated amorphous polyester, a melamine resin, and the like.

Hereinafter, an EM wave blocking member for a display apparatus according to examples in embodiments of the invention will be described in detail with reference to the appended drawings.

FIG. 1 is a cross-sectional diagram illustrating the EM wave blocking member 100 for the display apparatus according to an embodiment of the present invention.

Referring to FIG. 1, the EM wave blocking member 100 includes a transparent substrate, an electrode layer including a grounding electrode 140 and an auxiliary electrode 160 having a predetermined pattern, and a transparent conductive layer 180. According to the present exemplary embodiment of the invention, a glass substrate 120 may be used for the transparent substrate.

The electrode layer is formed on a surface of the glass substrate 120, and the transparent conductive layer 180 is formed on the electrode layer. The electrode layer includes the grounding electrode 140 formed to correspond to at least one frame area of the glass substrate 120, and the auxiliary electrode formed on the glass substrate 120 to be connected with the grounding electrode and having a mesh or stripe pattern.

The electrode layer is formed such that a conductive substance is printed on the glass substrate 120. A black ceramic substance (not shown) is generally printed on the frame area of the glass substrate 120 for decorative purpose. Then, to be in electrical contact with the case, the grounding electrode 140 is printed on an edge portion of the glass substrate 120. A region where the grounding electrode 140 is formed is a non-visible region (A), which is positioned on an edge portion of the display screen and different from a visible region (B) where an image from the panel assembly is displayed. The non-visible region (A) is a frame region of the glass transparent 120, that is, an edge portion of the PDP apparatus where a black ceramic substance is printed.

A silver paste may be used for the conductive substance, and a paste using a nano-silver powder may be preferably used for the conductive substance in order to obtain excellent electroconductivity and printing characteristics. A black-like color rather than a silver color may be preferably obtained after printing in order to improve image quality. For this purpose, the nano-silver paste is subjected to a blackening treatment such that a small amount of a black substance such as carbon, cobalt, copper and the like may be added in the nano-silver paste. When the blackening treatment is not performed with respect to the nano-silver paste, the paste will exhibit a color of the silver, copper, or the like, material which is used as conductive metal particles therein. For this reason, the color thereof may be corrected and a reflectance of the screen is reduced by adding the small amount of the black substance in the nano-silver paste, thereby improving visibility of the screen.

The grounding electrode 140 may be formed to have a width of about 12 mm using a screen printing scheme, and formed along at least one region of the edge region, that is, the non-visible region (A) of the glass substrate 120. Preferably, the grounding electrode 140 is formed along two regions of the edge region of the glass substrate 120 facing to each other so that each portion of the grounding electrode 140 is parallel to each other, or formed along the entire edge region of the glass substrate 120.

The auxiliary electrode 160 may have a mesh or stripe pattern, however, the present invention is not limited thereto. Thus, the auxiliary electrode 160 may have a geometrical pattern. The purpose of the mesh pattern of the auxiliary electrode 160 is different from that of an etching mesh in a typical mesh type electromagnetic wave blocking layer, and thus each having a different design. However, the mesh pattern of the auxiliary electrode 160 should be formed not to affect the display image because of being formed on the visible region (B).

When the incident light from the panel assembly is emitted to the outside, in order to acquire clear image quality of the display, an aperture ratio of the visible region (B) is required to be increased and a moiré phenomenon is required to be suppressed. For this purpose, a line width ($H_1$) of the auxiliary electrode 160 is required to be limited. The aperture ratio of the visible region (B) may decrease along with a large increase in the line width ($H_1$), and thereby an amount of the incident light from the panel assembly which is emitted to the screen is reduced, which results in a decline of the see-through characteristics of the display screen. Also, when the line width ($H_1$) is too small, the auxiliary electrode having a uniform line width may be difficult to be manufactured. Accordingly, the line width ($H_1$) of the auxiliary electrode 160 formed on the glass substrate 120 may be about 10 to 100 μm, and preferably, about 20 to 30 μm.

Also, a pitch ($H_2$) between neighboring auxiliary electrodes 160 is about 2 to 100 mm. In the case of the etching mesh in the existing mesh type-electromagnetic wave blocking layer, a line width of the etching mesh is generally about 12 μm, and a pitch, that is, an interval between mesh lines is generally about 250 to 300 μm. However, according to the present invention, since the auxiliary electrode 160 is used to support the electromagnetic wave shielding function of the transparent conductive layer, a pitch of the auxiliary electrode 160 is about several to tens of millimeters. In this manner, the pitch ($H_2$) of the auxiliary electrode 160 is relatively large, and thereby the line width ($H_1$) of the auxiliary electrode 160 may be not visible to viewers although being relatively great.

A method of manufacturing the electromagnetic wave blocking member 100 for the display apparatus may include printing a conductive substance on a surface of the glass substrate 120 to form an electrode layer; drying and reinforcing the glass substrate 120, and forming a transparent conductive layer 180 by stacking a metal thin film and a metal oxide thin film multiple times.

The printing may use a well-known screen printing scheme, and is not limited to a specific scheme.

The drying may be performed at a temperature of about 180 to 250° C., and the reinforcing may be performed such that the glass substrate 120 is subjected to heat treatment at a temperature of about 600 to 700° C. In the drying, a solvent of the silver paste is volatilized. In the reinforcing, fusion of metal particles within the glass and silver paste may occur. In the drying and reinforcing, a temperature for the heat treatment may be maintained for a predetermined period and at a predetermined value within the above described temperature range. The heat treatment in the drying and reinforcing may have several steps with different temperature range.

The conductive substance may use a silver paste which is subjected to a blackening treatment such that a black substance is added to carbon, cobalt, copper, or a combination thereof. The silver paste may be divided into two types of high and low temperature use. In the case where the electrode layer is formed with the silver paste using a polyethylene terephthalate (PET) film different from the glass substrate, the silver paste for low temperature use is required to be used, thereby preventing the base substrate from being transformed due to the heat. However, the silver paste for low temperature may have a relatively poor shielding ability in comparison with the silver paste for high temperature, and the electromagnetic wave blocking member which is manufactured by drying at a relatively low temperature may have relatively poor surface resistance characteristics in comparison with the electromagnetic wave blocking member which is manufactured by drying at a relatively high temperature.

Figure 2:
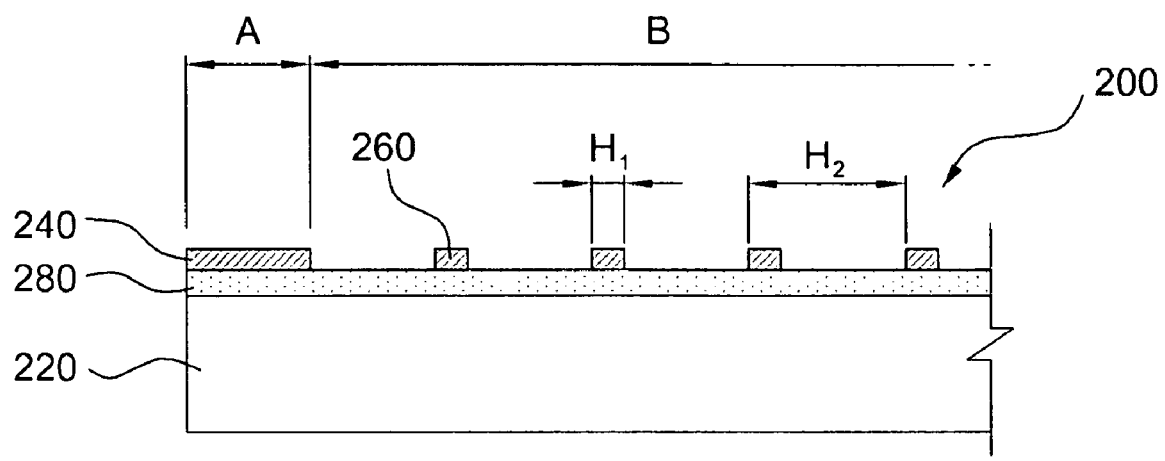
FIG. 2 is a cross-sectional diagram illustrating an electromagnetic wave blocking member for a display apparatus according to another embodiment of the present invention.

FIG. 2 is a cross-sectional diagram illustrating an electromagnetic wave blocking member 200 for a display apparatus according to another exemplary embodiment of the present invention.

Referring to FIG. 2, the electromagnetic wave blocking member 200 may include a transparent substrate 220, an electrode layer including a grounding electrode 240 and an auxiliary electrode 260 having a predetermined pattern, and a transparent conductive layer 280. According to the present exemplary embodiment of the invention, the transparent substrate 220 made of a transparent polymer resin may be used. The transparent conductive layer 280 may be formed on a surface of the transparent substrate 220, and the electrode layer may be formed on the transparent conductive layer 280. The electrode layer may include the grounding electrode 240 formed on an edge region of the transparent conductive layer 280 corresponding to at least one frame area of the transparent substrate 220, and an auxiliary electrode 260 formed on the transparent conductive layer 280 to be connected with the grounding electrode 240 and having a mesh or stripe pattern.

A method of manufacturing the electromagnetic wave blocking member 200 for the display apparatus may include printing a conductive substance on the transparent conductive layer 280 to thereby form the electrode layer after forming the transparent conductive layer 280 by stacking a metal thin film and a metal oxide thin film on a surface of the transparent substrate 220 a plurality of times, and drying the electrode layer. Repeated descriptions of the transparent substrate 220, the grounding electrode 240, the auxiliary electrode 260, and the transparent conductive layer 280 will be herein omitted.

Although not shown, the electromagnetic wave blocking member for the display apparatus according to another exemplary embodiment of the invention may include a plurality of wedge-shaped grooves formed on a surface of the transparent substrate, and each of the plurality of wedge-shaped grooves is filled with a conductive substance, a light absorption substance such as a carbon black, and the like. In this case, electromagnetic wave blocking efficiency may be significantly increased, and the electromagnetic wave blocking member may further perform an external light blocking function.

Hereinafter, the following Example and Comparison Example will illustrate the electromagnetic wave blocking member according to the present invention, in detail, but the present invention is not limited thereto.

Example 1

A glass substrate for the electromagnetic wave blocking member was prepared such that the grounding electrode was printed on the glass substrate while the auxiliary electrode having a line width of about 40 μm and a pitch of about 10 mm was printed within a visible region, and then was subjected to drying and reinforcing processes. A niobium oxide ($Nb_2O_5$) thin film, a zinc oxide (ZnO) thin film, a silver (Ag) thin film, another ZnO thin film, and another $Nb_2O_5$ thin film in the stated order was consecutively coated on the glass substrate four times resulting in a total of 20 thin films, and thus forming the transparent conductive layer to thereby manufacture the electromagnetic wave blocking member for the display apparatus.

A 7702UVS anti-reflection film of NOF Corp. and a 16 HG color correction film of Nippon Kayaku were joined on another surface of the glass substrate of the electromagnetic wave blocking member to thereby manufacture a PDP filter.

Figure 3:
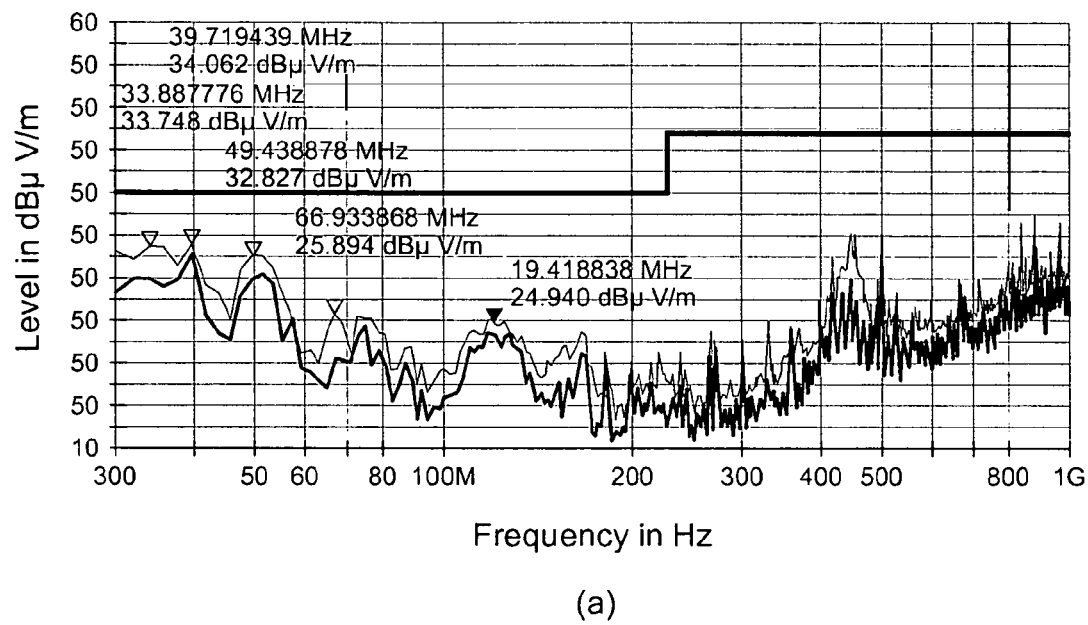
FIG. 3 is a graph illustrating results obtained by estimating an electromagnetic wave emissivity of an electromagnetic wave blocking member for a display apparatus manufactured according to Example 1, in which (a) and (b) show the estimation results with respect to vertical and horizontal direction of antenna, respectively.
Figure 3:
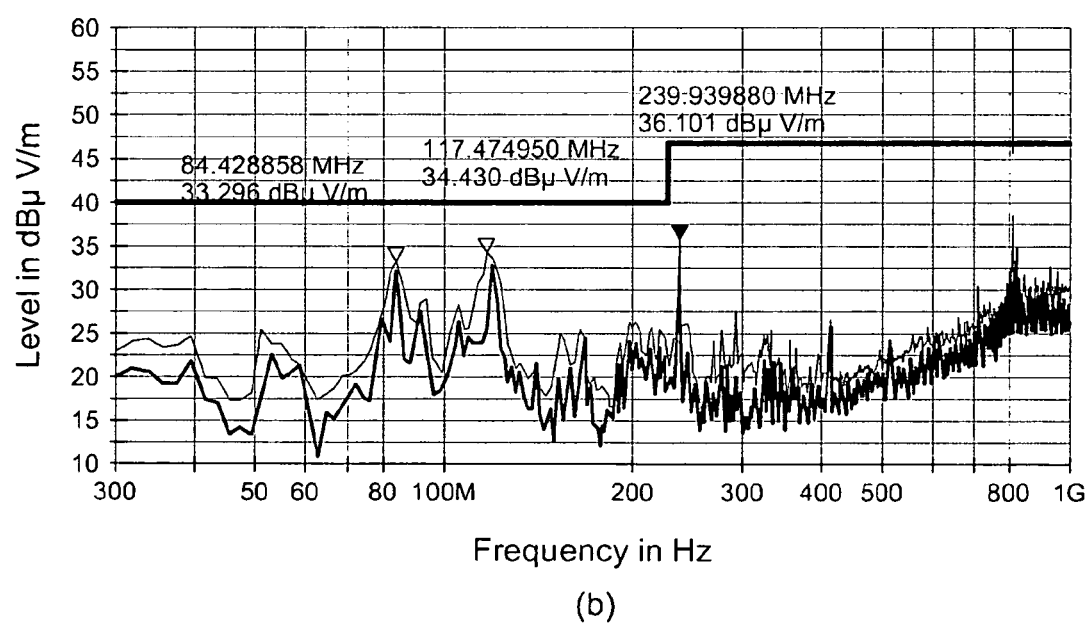

Next, the existing filter equipped on a 42-inch PDP TV (C7 model) of Samsung Corp. was removed, and the PDP filter was mounted thereon to assemble a TV set. Next, an emissivity of an electromagnetic wave of the TV set was measured in an electromagnetic wave laboratory of Gyeonggi Small & Medium Business Center (GSBC), and the measured results are shown in FIG. 3. Also, optical characteristics such as transmittance, surface resistance, reflectivity, haze, and the like were further measured by cutting the PDP filter. In this instance, the transmittance was measured using Lambda 950 spectrophotometer, and the surface resistance was measured using a non-contact type surface resistance meter. The reflectivity was measured using CM-2600d of Minolta, and the haze was measured using Haze Guard. The measured results are shown in Table 1 below.

Comparative Example 1

In this example, the electromagnetic wave blocking member for the display apparatus was manufactured in the same manner as Example 1, but only the grounding electrode was printed on the glass substrate, and the auxiliary electrodes were omitted.

Figure 4:
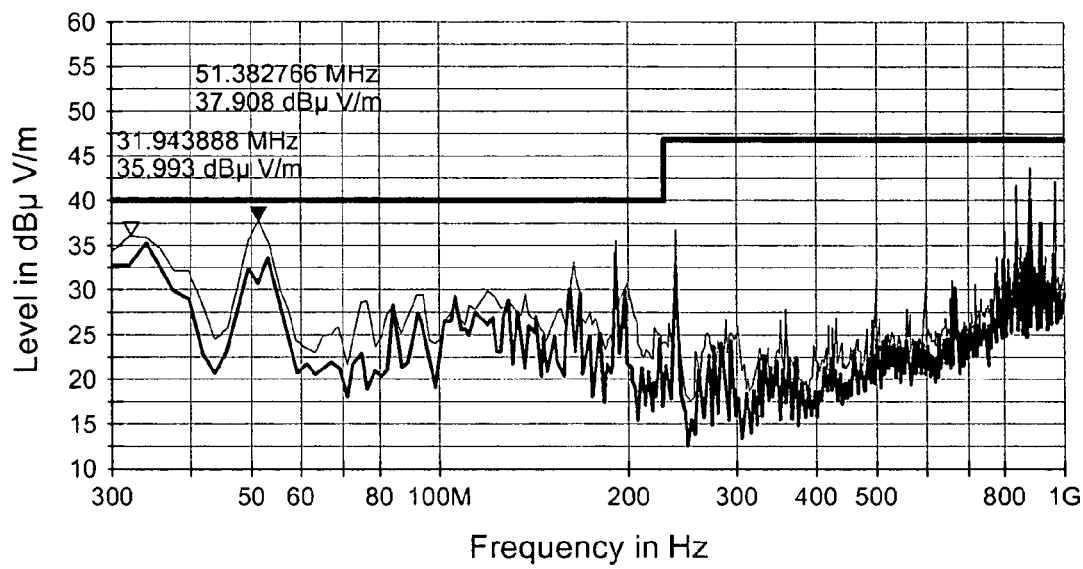
FIG. 4 is a graph illustrating results obtaining by estimating an electromagnetic wave emissivity of an electromagnetic wave blocking member for a display apparatus manufactured according to Comparative Example 1, in which (a) and (b) show the estimation results with respect to vertical and horizontal direction of antenna, respectively.
Figure 4:
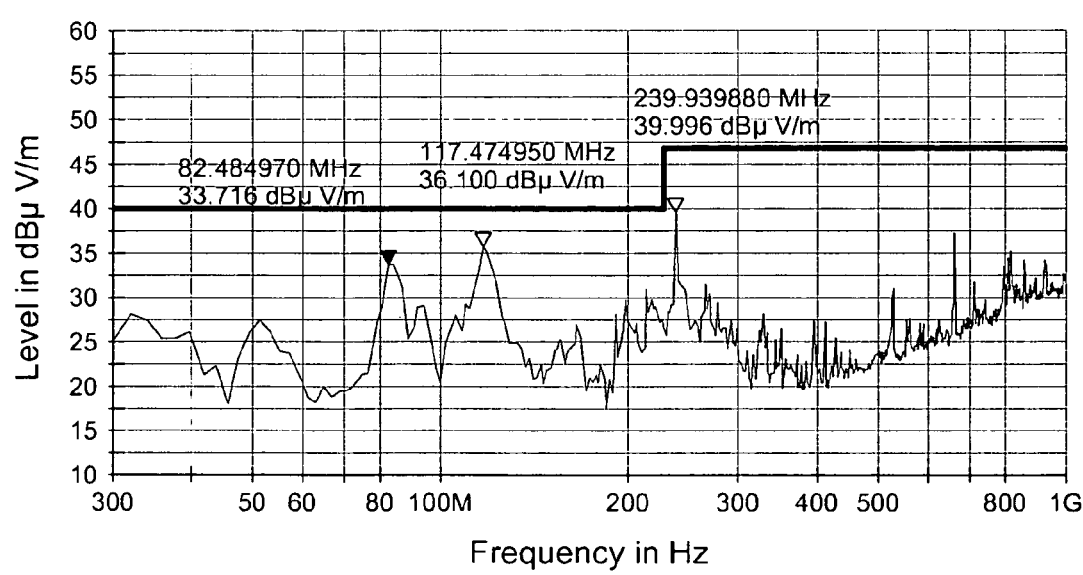

Next, an emissivity of the electromagnetic wave was measured in the same manner as Example 1, and the measured result was shown in FIG. 4, and results obtaining by measuring optical characteristics such as transmittance, surface resistance, reflectivity, haze, and the like are shown in the following Table 1.

TABLE 1

| Items | Example 1 | Comparative Example 1 |
|---|---|---|
| Margin of emissivity of electromagnetic wave (dB, vertical direction of antenna) | 6.0 | 2.1 |
| Margin of emissivity of electromagnetic wave (dB, horizontal direction of antenna) | 5.6 | 3.9 |
| Transmittance (%) | 43.8 | 44.5 |
| Surface resistance (Ω/□) | 0.53 | 0.79 |
| Reflectivity (%) | 3.1 | 3.0 |
| Haze (%) | 0.8 | 0.8 |

As can be seen, an electromagnetic wave-blocking performance improved for the electromagnetic wave blocking member according to Example 1. In addition, there was also seen an increase in the margin of emissivity of the electromagnetic wave on a basis frequency of about 30 to 210 MHz. Thus, as to the electromagnetic wave blocking member for the display apparatus according to an embodiment (Example 1) of the present invention, the surface resistance was reduced and the margin of emissivity of the electromagnetic wave was increased while optical characteristics such as transmittance, reflectivity, haze, and the like were maintained to be equal to or similar with those in the existing electromagnetic wave blocking member, thereby improving the electromagnetic wave-blocking performance.

As described above, according to the present invention, there is provided the electromagnetic wave blocking member for the display apparatus in which an unseen thin line even in a visible region is printed to thereby form the auxiliary electrode at the time of printing the grounding electrode so as to complement the electromagnetic wave blocking performance of the transparent conductive layer, thereby improving the electromagnetic wave blocking performance. Also, the auxiliary electrode and the grounding electrode are printed on the transparent substrate, thereby effectively forming the electrode layer with a single process without performing a further process.

According to one or more embodiments of the present invention, there is provided the electromagnetic wave blocking member for the display apparatus. Improvements may be obtained in a blocking ability of the electromagnetic wave blocking layer of the conductive type, and manufacturing costs of the filter for the display apparatus may be reduced. It may also benefit manufacturing the filter for the display apparatus due to simplification in the manufacturing process.

Although a few embodiments of the present invention have been shown and described by way of example, the present invention is not limited to the described embodiments. Instead, it would be appreciated by those skilled in the art that changes may be made to the embodiments shown by way of the examples herein without departing from the principles and spirit of the invention, the scope of which is defined by the claims and their equivalents.

The invention claimed is:

1. An electromagnetic wave blocking member for a display apparatus, the electromagnetic wave blocking member, comprising:

a transparent substrate including a plurality of wedge-shaped grooves in a major surface thereof, and a conductive substance disposed in said grooves;

an electrode layer including:

i) a grounding electrode overlying a frame area of the transparent substrate, the frame area being at least a portion of an edge region of the transparent substrate, and ii) an auxiliary electrode overlying the transparent substrate for connection with the grounding electrode and having a mesh or stripe pattern, wherein a line width of the auxiliary electrode is about 10 to 100 μm, and a pitch thereof is about 2 to 100 mm; and a transparent conductive layer disposed either overlying the electrode layer or between the transparent substrate and the electrode layer.

2. The electromagnetic wave blocking member of claim 1, wherein the transparent substrate includes at least one of a glass or a transparent polymer resin.

3. The electromagnetic wave blocking member of claim 1, wherein the auxiliary electrode includes a silver paste which includes at least one substance selected from the group consisting of carbon, cobalt, and copper.

4. The electromagnetic wave blocking member of claim 3, wherein the auxiliary electrode is formed by a step including subjecting the silver paste to blackening treatment.

5. The electromagnetic wave blocking member of claim 1, wherein the transparent conductive layer includes a series of a metal thin film alternating with a metal oxide thin film a plurality of times.

6. An electromagnetic wave blocking member for a display apparatus, the electromagnetic wave blocking member, comprising:

a transparent substrate having a visible region through which an image can be displayed, and a second region beyond the visible region;

an electrode layer including:

i) a grounding electrode overlying at least a portion of the second region of the transparent substrate, and ii) an auxiliary electrode overlying the visible region for connection with the grounding electrode and having a mesh or stripe pattern, wherein a line width of the auxiliary electrode is about 10 to 100 μm, and a pitch thereof is about 2 to 100 mm; and a transparent conductive layer disposed either overlying the electrode layer or between the transparent substrate and the electrode layer.

7. The electromagnetic wave blocking member of claim 6, wherein the second region is a frame area of the transparent substrate, and the visible region is bounded by the frame area.

8. An electromagnetic wave blocking member for a display apparatus, the electromagnetic wave blocking member, comprising:

a transparent substrate;

an electrode layer including:

i) a grounding electrode overlying a frame area of the transparent substrate, the frame area being at least a portion of an edge region of the transparent substrate, and ii) an auxiliary electrode overlying the transparent substrate for connection with the grounding electrode and having a mesh or stripe pattern, wherein a line width of the auxiliary electrode is about 10 to 100 μm, and a pitch thereof is about 2 to 100 mm; and a transparent conductive layer disposed either overlying the electrode layer or between the transparent substrate and the electrode layer, wherein the electromagnetic wave blocking member is constructed to perform an external light blocking function.

9. The electromagnetic wave blocking member of claim 1, wherein a width of the grounding electrode is different than the line width of the auxiliary electrode.

10. The electromagnetic wave blocking member of claim 1, wherein the auxiliary electrode is configured to support the electromagnetic wave shielding function of the transparent conductive layer.

11. The electromagnetic wave blocking member of claim 10, wherein the pitch of the auxiliary electrode is much larger than the pitch of an etching mesh of a mesh type-electromagnetic wave blocking layer.

12. The electromagnetic wave blocking member of claim 6, wherein the auxiliary electrode is configured to support the electromagnetic wave shielding function of the transparent conductive layer.

13. The electromagnetic wave blocking member of claim 8, wherein the auxiliary electrode is configured to support the electromagnetic wave shielding function of the transparent conductive layer.

* * * * *